(12) United States Patent
Sunter

(10) Patent No.: US 8,489,947 B2
(45) Date of Patent: Jul. 16, 2013

(54) CIRCUIT AND METHOD FOR SIMULTANEOUSLY MEASURING MULTIPLE CHANGES IN DELAY

(75) Inventor: Stephen Kenneth Sunter, Ontario (CA)

(73) Assignee: Mentor Graphics Corporation, Wilsonville, OR (US)

( * ) Notice: Subject to any disclaimer, the term of this patent is extended or adjusted under 35 U.S.C. 154(b) by 215 days.

(21) Appl. No.: 13/018,002

(22) Filed: Jan. 31, 2011

(65) Prior Publication Data

US 2011/0202804 A1    Aug. 18, 2011

Related U.S. Application Data

(60) Provisional application No. 61/304,629, filed on Feb. 15, 2010.

(51) Int. Cl.
  *G01R 31/28* (2006.01)
(52) U.S. Cl.
  USPC ............. 714/726; 714/731; 702/79; 327/161; 324/76.54
(58) Field of Classification Search
  USPC ... 714/726, 731; 324/76.54; 702/79; 327/161
  See application file for complete search history.

(56) References Cited

U.S. PATENT DOCUMENTS

| | | | |
|---|---|---|---|
| 5,621,739 A | 4/1997 | Sine et al. | |
| 6,058,496 A | 5/2000 | Gillis et al. | |
| 6,586,921 B1 | 7/2003 | Sunter et al. | |
| 6,724,210 B2 | 4/2004 | Combs et al. | |
| 7,158,899 B2 | 1/2007 | Sunter et al. | |
| 7,202,656 B1* | 4/2007 | Gearhardt et al. | 324/76.53 |
| 7,453,255 B2 | 11/2008 | Sunter et al. | |
| 2002/0133795 A1* | 9/2002 | Yamada | 716/4 |
| 2006/0123305 A1* | 6/2006 | Linam et al. | 714/744 |
| 2009/0228227 A1* | 9/2009 | Suda | 702/79 |

OTHER PUBLICATIONS

"A Cost/Benefit Analysis of the P1149.4 Mixed Signal Test Bus" by Sunter in IEE Proceedings, Circuits, Devices, and Systems, Dec. 1996.
"Delay test of Chip I/Os Using LSSD Boundary Scan" by Gillis et al. in Proceedings of the 1996 International Test Conference.
"A General Strategy for BIST of High-Speed Analog Functions", by Sunter in the informal proceedings of the Workshop on Test and Verification of High-Speed Analog Circuits, Nov. 2009.

* cited by examiner

*Primary Examiner* — Guy Lamarre

(57) ABSTRACT

A circuit and method provide built-in measurement of delay changes in integrated circuit paths. The circuit includes a digital shift register to access multiple paths, and may be implemented in digital boundary scan to test I/O pin delays. Synchronous to a first frequency, the circuit applies an alternating signal to the paths and samples the paths' output logic values synchronous with a second frequency that is asynchronous and coherent to the first clock frequency. The shift register conveys the samples to a modulo counter that counts the number of samples between consecutive rising or consecutive falling edges in the signal samples from a selected path. Between the two edges, the path or a path characteristic is changed, and the resulting modulo count after the second edge is proportional to the change in delay. The circuit can compare the count, or the difference between counts, to test limits.

23 Claims, 12 Drawing Sheets

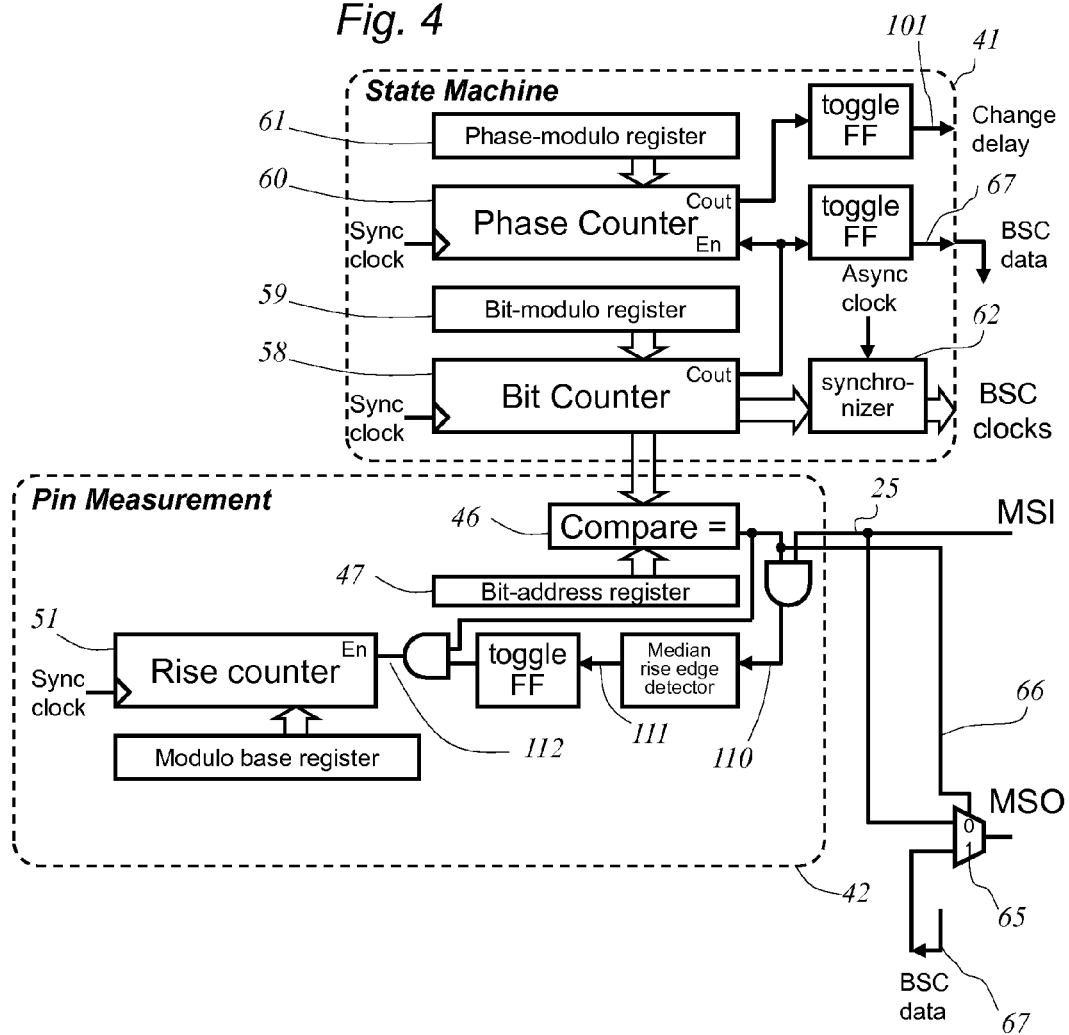

Increasing the time between updates (by slowing the sync clock frequency) allows leakage or pull-up/down to take effect.

Requires measurement counter to be modulo N/4

CIRCUIT AND METHOD FOR SIMULTANEOUSLY MEASURING MULTIPLE CHANGES IN DELAY

RELATED APPLICATIONS

This application claims priority to U.S. Provisional Patent Application No. 61/304,629, entitled "I/O BIST," filed on Feb. 15, 2010, and naming Stephen Sunter as inventor, which application is incorporated entirely herein by reference.

FIELD OF THE INVENTION

This invention relates to measuring signal propagation delays to characterize and test integrated circuits (ICs) and systems containing ICs.

BACKGROUND OF THE INVENTION

A standardized way to provide test access to digital pin signals of an IC is to implement digital boundary scan according to the rules defined in the "IEEE Standard Test Access Port and Boundary-Scan Architecture", published by the Institute for Electrical and Electronic Engineers (IEEE), which is also known as IEEE Std 1149.1-2001, or simply 1149.1. A dominant characteristic of 1149.1 is the use of a Test Access Port (TAP) controller and a shift register referred to as the Boundary Scan Register (BSR).

The cost of automatic test equipment that tests ICs is proportional to the number of IC pins to be accessed, and the required measurement accuracy. Circuitry on an IC that is consistent with 1149.1 can facilitate reduced pin-count (RPC) access to the IC, which significantly reduces the cost of the tester needed to test the IC. To facilitate RPC test access, pin circuitry is made bi-directional and boundary scan circuitry is added as shown in FIG. 1. An output driver 11 may be enabled by an Enable bit in the boundary scan cell (BSC) 2, and the output Data value and/or captured Data value is stored in BSC 1.

In "A Cost/Benefit Analysis of the P1149.4 Mixed Signal Test Bus," by Sunter in IEE Proceedings, Circuits, Devices, and Systems, December 1996, it is noted that the IEEE "P1149.4 bus allows testing of [pin] parameters without requiring a probe for each pad." The circuit described uses an analog bus to access the voltage or logic value at each pin. An all-digital circuit is desired to provide a faster, more robust measurement.

In U.S. Pat. No. 5,621,739 by Sine et al. in 1997, an IC's input/output (I/O) buffer is self-tested by utilizing "an adjustable delay circuit to test whether the buffer can capture a data value during a variable strobe window." It includes a comparison circuit to detect whether the captured data value matches an expected value. In U.S. Pat. No. 6,058,496 by Gillis et al. in 2000, and "Delay test of Chip I/Os Using LSSD Boundary Scan" by Gillis et al. in Proceedings of the 1996 International Test Conference, an adjustably-timed series of clock edges clocks boundary scan latches to launch data edges to a pin of the IC and another boundary scan latch captures the pin's logic value, to enable measuring delays between a path including the pin and a path not including the pin, without tester or load connections to the pin "that can degrade accuracy of testing." One embodiment adjusts the clock edge times in the tester, and another embodiment adjusts an on-chip delay line. The launch and capture times are controlled by separate clocks having the same frequency but an adjustable phase offset. Delay circuits on an IC ("on-chip") have significant jitter caused by power supply noise and significant delay variation caused by temperature and processing variations. Delay resolution achievable with purely digital delay circuits is usually equal to the delay of a logic gate. A circuit that avoids the use of on-chip adjustable delays and tester-adjusted phase offsets would advantageously permit accurate self-testing an IC in a system that includes connections to components external to the IC ("off-chip"). Furthermore, the measurement's relevance can be improved if external load impedances comparable to that in the IC's intended application are connected while measuring I/O performance.

In U.S. Pat. No. 6,586,921 by Sunter et al. in 2003, incorporated herein by reference, the leakage current at an IC's I/O pin is tested, without tester connections to the pin, using the circuit of FIG. 1 and the signal timing shown in FIG. 2. In that method, the pin is driven to a data value and at a time $t_1$ the pin is tri-stated. At a pre-determined later time $t_2$, the pin's logic value is captured. If the logic value is the same as the originally driven data value, then the leakage current is lower than a pre-determined threshold current. If an off-chip capacitance is connected to the pin, then the time $t_2$ is chosen to be later by an amount proportional to the increase in total pin capacitance. If an off-chip pull-up or pull-down resistance is connected to the pin, then the pin's current will include current flowing through the resistance, and the time $t_2$ is chosen to be sooner by an amount proportional to the increase in total current flowing through the pin (equal to leakage current plus current through the resistance). A circuit that can generate edges with fine resolution in a range of capture times between $t_1$ and $t_2$ would advantageously permit in-system testing of higher leakage currents and lower resistances.

In U.S. Pat. No. 6,724,210 by Combs et al. in 2004, the presence of a chip-to-package connection is determined by detecting an increase in the delay of the pin driver relative to its unloaded delay, and, since the delay increase is normally imperceptible, substitutes an especially weak driver so that the delay increase is more easily detected. It is also noted that the delay could be compared "with one or more characteristics of another I/O" so that sensitivity to normal variations between ICs is reduced. A circuit that does not require any modification to normal output drivers and boundary scan circuitry would advantageously avoid re-designing existing circuitry and minimize impact on driver performance. A circuit that compared a measured delay to the average characteristic value of multiple I/Os would further reduce the test's sensitivity to normal variations in ICs.

In U.S. Pat. No. 7,453,255 by Sunter et al. in 2008, incorporated herein by reference, circuitry is described that can "measure the delays of input and output circuitry that is controlled by a boundary scan resister within an IC." The circuit uses an undersampling clock whose frequency is slightly different from the undersampled signal's clock frequency divided by an integer, and measures the delay between median edge positions of the undersampled signal by producing "a combined output whose duty cycle is proportional to the time interval." The circuit measures one set of boundary scan cell delays relative to a common clock, and then a second set of delays that include the I/O pad drivers, and then subtracts each delay of the first set from the corresponding delay of the second set. A measurement circuit is desired that can be simple enough to incorporate on-chip economically for in-system measurements of many I/O circuits simultaneously, and that can measure a delay difference between two circuit paths, or between two conditions of one circuit path, without measuring each delay separately since each delay involves two edges and hence four sources of variation per delay difference, and without combining two undersampled signals to produce a duty cycle since only one signal is accessible at a time via a boundary scan shift register.

In "A General Strategy for BIST of High-Speed Analog Functions", by Sunter in the informal proceedings of the *Workshop on Test and Verification of High-Speed Analog Circuits*, November 2009, it is shown how the technique described above herein in the Sunter patent '255 and in U.S. Pat. No. 7,158,899 by Sunter et al., incorporated herein by reference, can be applied to measuring analog circuit parameters by converting the parameters to periodic time delays whose duty cycle or jitter can be measured. According to that paper, one measurement circuit can measure one parameter for one circuit at a time. It is desired to measure timing properties derived from parameters for many analog circuits simultaneously (i.e., in parallel) to reduce total measurement time.

Note that bond pads of a bare IC die may be connected to the pins of an encapsulating package, or to another component within such a package. In this disclosure, "pin", "bond pad" and "pad" will be used interchangeably. A pad may be considered to be merely an enlarged metal area of a wire path that has a driver and a receiver. An "I/O" will be considered as any signal node of a circuit under test (CUT) at which signals may be injected or monitored, especially nodes that are primary inputs or outputs of ICs. An I/O may be a pin or pad, or a through-silicon via (TSV), or simply an on-chip connection to another on-chip logic gate.

It is desirable to accurately and automatically measure delays of paths within an IC, especially paths that include I/O pin driver and receiver delays, with or without off-chip connections, without using adjustable delay lines or off-chip measuring equipment, and without precisely-timed clock edges from outside the IC, other than clocks with known frequencies. "Measure" means generate a (binary-coded) number that is proportional to a delay of interest. Delays of interest include, but are not limited to, data and control signal propagation delays for rising and falling transitions. The delay may be dominated by inherent propagation of a signal through a driver and receiver, the capacitance of the driver's load, the inherent leakage current of a tri-stated driver output, the resistance of a pull-up or pull-down resistor, and any of various other comparable delays. Delay measuring usually includes irrelevant delays, for example the delay from a measurement circuit to a path of interest, so it is an objective of the present invention to measure delay differences or changes, so that irrelevant delays can be cancelled (subtracted) from the measurement result. It is also desirable to test delays, where "test" means to measure and then compare the measurement to upper and/or lower limits to produce a pass/fail result.

It is further desirable to test many such delays simultaneously since an IC may have hundreds or thousands of path delays to be measured, including I/O paths. It is still further desirable to test mismatches between signal rise and fall delays for a path, and between delays for multiple I/Os, and between delays within a group and the average delay of the group. It is still further desirable to test delay-related parameters of multiple analog circuits simultaneously because analog circuits often have long time constants (settling delays) so measuring their parameters in parallel is an effective way to reduce total measurement time.

BRIEF SUMMARY OF THE INVENTION

The circuit according to various embodiments of the invention provides built-in measurement and test of IC path delays, mismatches or differences between IC path delays, and changes in path delays, especially for I/O pin circuitry and connections to the pins. The circuit includes a shift register, such as a boundary scan register, to access each path. Synchronous to a first clock frequency, the circuit applies an alternating signal to each path, and samples an output of each path's logic value synchronous to a second clock frequency which is asynchronous and coherent to the first clock frequency.

An analysis circuit, that includes a modulo counter, monitors the captured samples for each path of multiple paths as the samples are shifted serially out of the shift register, and based on the sample values, computes a change in delay for each path by counting the number of clock cycles between a first detected edge in the signal samples and a second detected edge of the same type (i.e., rising or falling). The delay is changed after detecting the first edge, before detecting the second edge, and the change is caused by selecting a second path between the applied alternating signal and the path's sampled output, or by selecting a second characteristic of the first path. Multiple analysis circuits can be connected to the shift register so that delay changes for multiple paths can be measured simultaneously. The modulo base for the modulo counter is chosen to be equal to a multiple of the number of clock cycles in the beat period between the first and second clock frequencies, where the beat period is equal to the time interval spanned by the smallest integer number of cycles of one of the clocks that is equal to a different integer number of cycles of the other clock.

For each of the multiple paths, the circuit simultaneously measures any or all of the following: a rise delay, a fall delay, an average rise delay, and an average fall delay. The delay may be affected by on-chip or off-chip impedance, which may comprise any combination of resistance, capacitance, and inductance. For each of the multiple paths, the circuit also tests any or all of the following: a rise delay, a fall delay, a mismatch between rise and fall delays, a mismatch between the delays of different paths, a mismatch between the delay of one path and the average of multiple paths that include that one path.

A delay path could be through a digital circuit, in which case the delay might be a data signal propagation delay and the change in delay might be proportional to a propagation delay through a portion of the digital circuit, or the change in delay for a single path might be proportional to a signal rise time. A delay path could be through an analog circuit whose analog output is converted to a digital value by a comparator or latch, in which case the change in delay might be proportional to a phase delay or a signal slew rate.

BRIEF DESCRIPTION OF THE DRAWINGS

FIG. 4 is a schematic of delay measurement block 20 in FIG. 3.

DETAILED DESCRIPTION OF THE INVENTION

In the following detailed description, numerous specific details are set forth in order to provide a thorough understanding of the present invention. However, it will be understood by those skilled in the art that the present invention may be practiced without these specific details. In other instances, well known methods, procedures, components and circuits have not been described in detail so as not to obscure aspects of the present invention.

Figure 1:
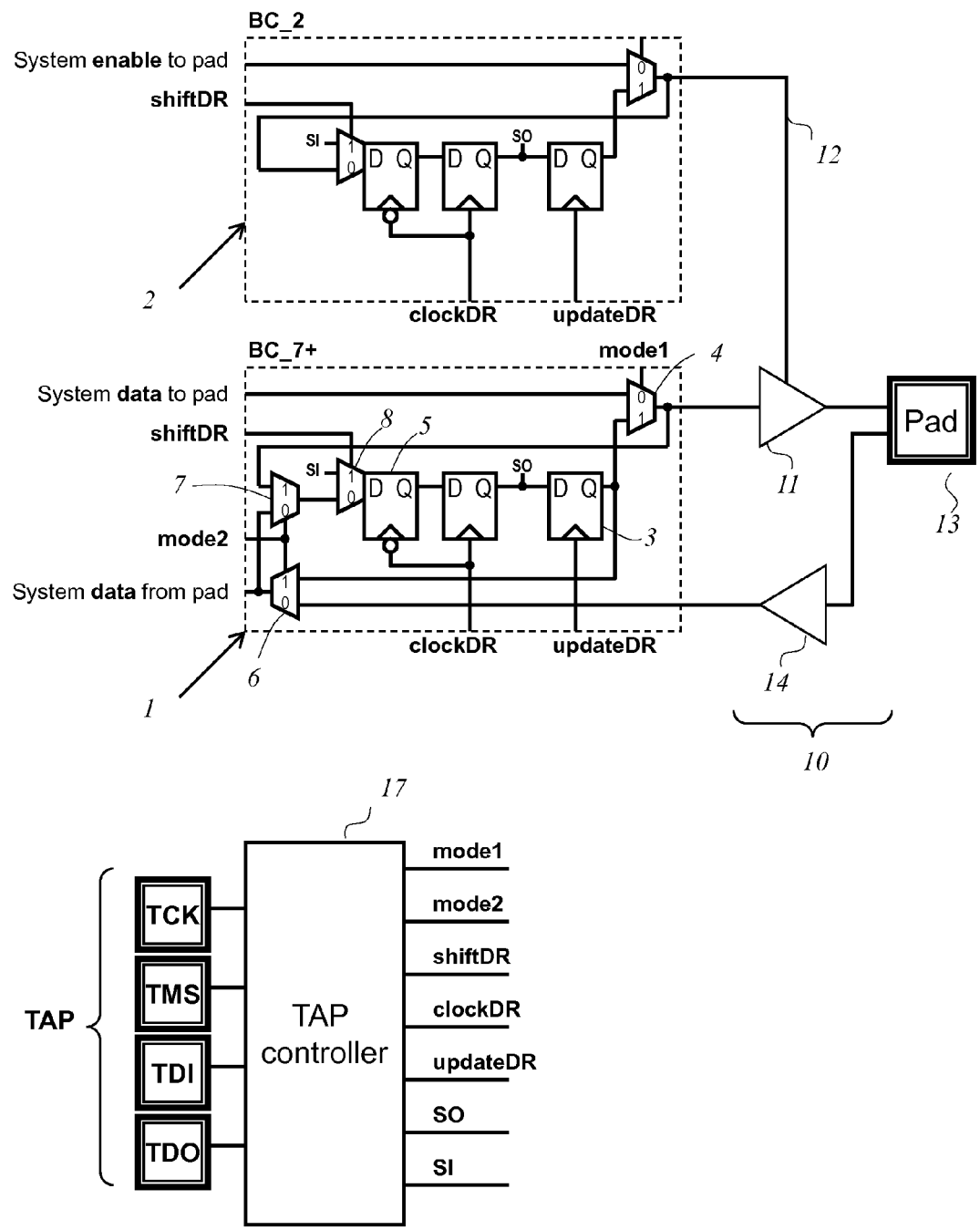
FIG. 1 is a schematic of a bi-directional pin of an IC, with two boundary scan cells (similar to cells BC_2 and BC_7 defined in 1149.1) and a TAP controller consistent with 1149.1.

The circuit of FIG. 1 shows two boundary scan cells, consistent with 1149.1 specifications and connected to pad I/O circuitry of an IC. One cell 1 provides test data to the pad's driver 11 from an update latch 3 connected to a parallel output SO of the BSR, and captures data from the pad's receiver 14 via multiplexer 7 at a parallel input to the BSR, and one cell 2 provides an enable signal 12 to the pad driver.

Consistent with 1149.1, a common TAP controller 17 provides clocks (clockDR and updateDR) and control signals (mode1, mode2) to the boundary scan cells for any number of pins of the IC. The TAP controller also provides scan-in data (SI) to the first BSC in a BSR, and receives scan-out data (SO) from the last BSC in the BSR; the SO output of each BSC is connected to the SI input of each subsequent BSC in the series.

Figure 2:
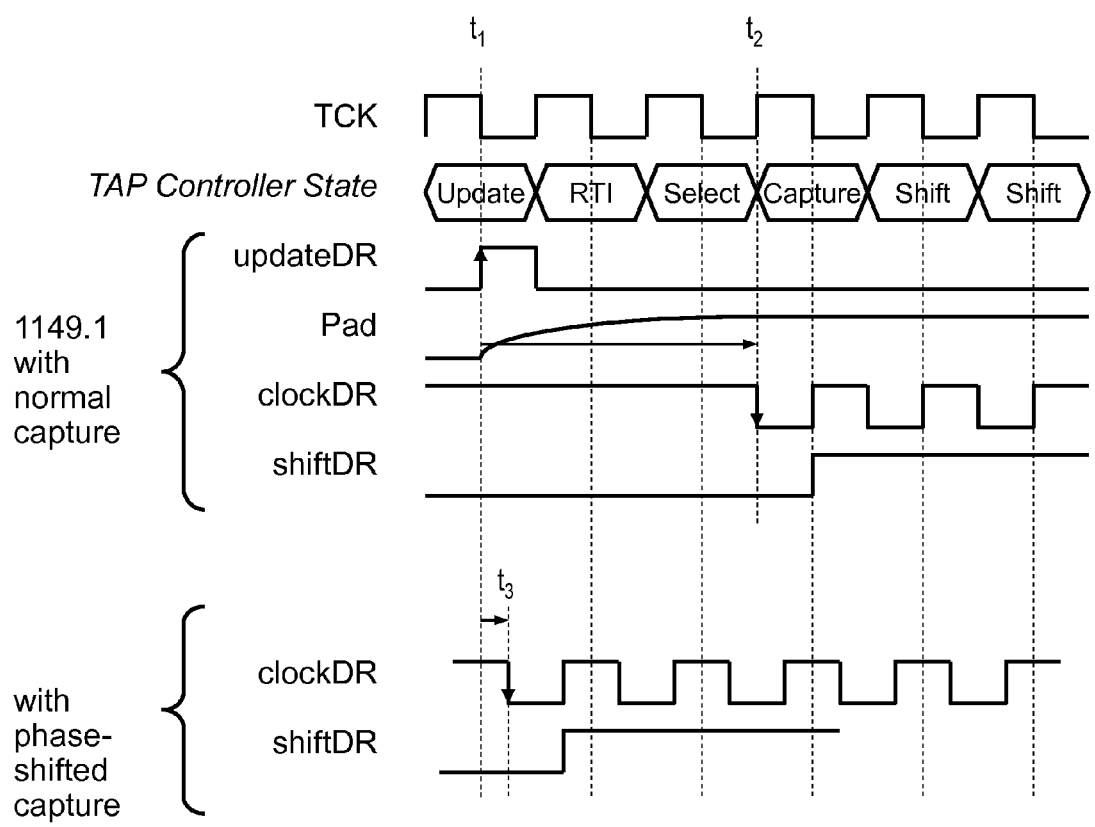
FIG. 2 is a set of waveforms for the circuit of FIG. 1 when conventional methods are used for 1149.1-based testing, showing waveforms for normal capture and for capture controlled by a phase-shifted synchronous clock.

Example waveforms for the circuit of FIG. 1 are shown in FIG. 2, with waveform labels indicating the wire on which the signal occurs. Waveforms are shown for normal update at time $t_1$ and capture at time $t_2$, consistent with 1149.1, and also shown for a capture edge whose edge time is phase-advanced to time $t_3$ (a capture edge is any falling edge in clockDR that occurs while shiftDR is logic 0). According to the patent by Gillis et al., a phase shift is accomplished using an adjustable-delay circuit on-chip or clock-delaying capability in automatic test equipment (ATE) connected to the IC.

Figure 3:
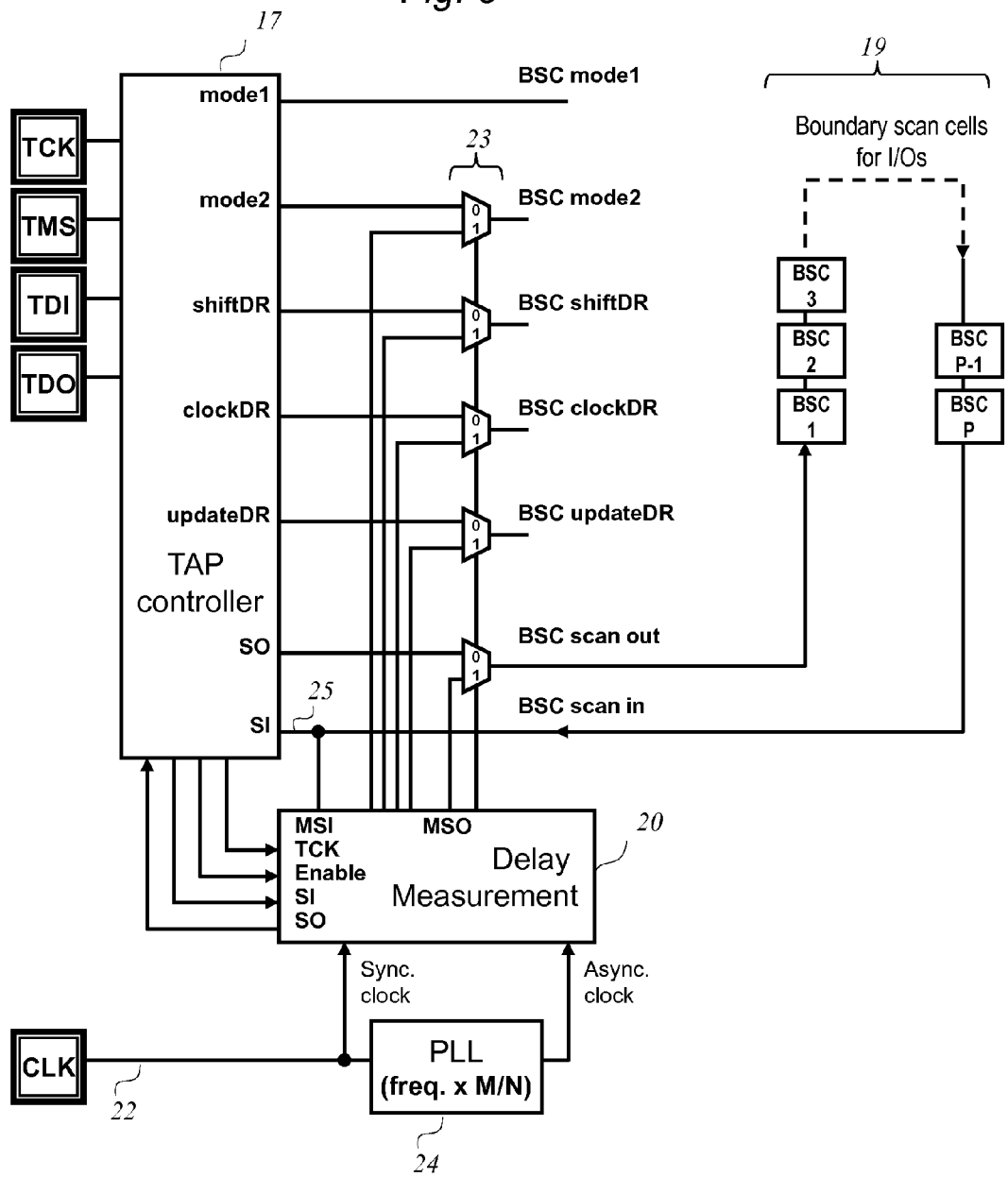
FIG. 3 is a block-level schematic of a circuit, showing connections between a delay measurement block 20, an 1149.1 TAP controller 17, and a boundary scan register 19, according to an embodiment of the invention.

According to various embodiments of the invention, the BSC shown in FIG. 1 is used without modification by inserting multiplexers 23 between the common TAP controller and the boundary scan cells, as shown in FIG. 3, to permit Delay Measurement circuit block 20 to control the clocks and mode signals, scan-in data, and monitor scan-out data.

The Delay Measurement circuit block 20 requires two clocks. The first clock may be a reference clock 22 of the IC, provided from off-chip via a pin of the IC. The second clock must be asynchronous to the first clock, and may be generated by a phase-locked loop (PLL) 24 whose input clock is the first clock, and whose output clock frequency is M/N times the PLL's input clock frequency. The M/N ratio makes the two clocks coherent to each other. In various embodiments of the invention, M=N−1 or M=N+1, and N is an integer. For example, N could equal 20 and M could equal 19.

Typically, PLLs are used in ICs to generate clock frequencies for on-chip logic at frequencies higher than provided to the IC's clock pin. Typical PLLs have an input binary divider that divides the PLL's input frequency by N, and a feedback binary divider that divides the PLL's output frequency by M before comparing it to the input that has been divided by N. As a result the PLL's output clock frequency is M/N times the PLL's input clock frequency, the PLL's output clock period is N/M times the PLL's input clock period and every $M^{th}$ rising edge of the output clock will be aligned with every $N^{th}$ rising edge of the input clock but all other edges will be misaligned by increasing amounts. A "beat period" between the PLL's input clock and output clock will equal N cycles of the input clock, and M cycles of the PLL output clock, and if M/N is a reduced fraction, then the beat period will equal the time interval spanned by the smallest integer number of cycles of one of the clocks that is equal to a different integer number of cycles of the other clock. The input and output clock frequencies will be asynchronous (meaning that rising edges of one of the clocks will not have a constant phase offset relative to rising edges of the other clock) and coherent.

The sampling resolution, $T_{RES}$, for delay measurement is proportional to the difference between the two clock periods. In one embodiment of the invention, described later for FIG. 5b, the sampling resolution is equal to twice the difference between the two clocks' periods. For example, if the first clock frequency is 52.63 MHz, which has a period of 19 ns, and M/N=19/20, then the second clock frequency will be 52.63×19/20=50 MHz, which has a period of 20 ns, and the sampling resolution will be 2 ns (two nanoseconds). The factor of two arises from the fact that every time the clocks' rising edges align, the signal of interest is either rising or falling, so each sample of a signal rising edge occurs every second time the two clocks align. In other embodiments of the invention, described later for FIG. 6, the resolution is equal to the difference in clock periods.

Other clock generation circuits can generate the same clock period relationship: for example, the first clock could be generated by a second PLL; both the first and second clocks could be generated by two PLLs that use a common input clock; both the first and second clocks could be generated by clock generators in an ATE; one of the clocks could be the TCK clock provided to the TAP controller. The PLLs may be on-chip or off-chip. For convenience, henceforth the first clock will be referred to as the Sync clock and the second clock as the Async clock, and M=N−1. In various embodiments of the invention, all logic is clocked by the Sync clock, except for some circuitry in the synchronizer 62.

In various embodiments of the invention, the Delay Measurement block 20 includes the circuit functions shown in FIG. 4. Various other smaller circuit blocks are included, as will be described herein, but are too many to be included in FIG. 4.

State Machine circuit block 41 generates the two clocks for the boundary scan cells and alternates (toggles) the BSC data signal delivered to them on output 67. The block includes two programmable binary counters comprising a Bit Counter 58 to indicate which BSR bit sample is being scanned out, and a Phase Counter 60 to indicate how many clock phase positions have been sampled by the BSR. The block also includes a Synchronizer 62 that produces capture edges derived from Async clock edges occurring in an interval that surrounds each update edge.

In various embodiments of the invention, the Delay Measurement block is inactive until it is enabled by a signal from the TAP controller, and after an enable signal is received, measurement begins when a rising edge of the Sync clock aligns with a falling edge of the Async clock.

Bit Counter 58 is a modulo counter with modulo base K, where K equals one plus the smallest multiple of N that is greater than the length, P, of the BSR, where P is a number of bits. That value of K allows time for all BSR bits to be shifted out after each capture, and ensures that the relative time between each update latch's clock edge and each capture latch's clock edge increments by the difference in clock periods. For example, if N=20, and P=15, then K should equal 21, but if P=110, then K should equal 121. In various embodiments of the invention, the counter decrements by 1 each cycle of the Sync clock until the count is 0, at which time it reloads on the next cycle the value K−1 from Bit-modulo register 59, and then continues to decrement each clock cycle; it does this repeatedly until a measurement is complete. The Bit Counter's output count (when it is less than or equal to P) indicates the bit number that corresponds to the bit being shifted out of the last BSC in the BSR (i.e. the BSC whose output is the serial output of the whole BSR) and into the BSR, with the last bit register in the chain being bit P, as shown in FIG. 3, and the first being bit 1. Shifting of the BSR is enabled whenever the Bit Counter count is less than or equal to P.

Phase Counter 60 counts modulo L, where L=N in one embodiment. In various embodiments of the invention, synchronous to the Sync clock, the Phase Counter is initialized for a path delay measurement by loading the count L−1 from Phase-modulo register 61, and then each time the Bit Counter reaches count 0, the Phase Counter decrements by 1, until the Phase Counter count is 0, at which time a second path or delay condition is selected and the Phase Counter reloads L−1 on the next cycle, and then continues to decrement each time the Bit Counter reaches count 0 until the Phase Counter count is 0. In various embodiments of the invention, the Phase Counter runs twice through its entire count sequence: one full count cycle while a first delay path is selected; and a second full cycle while a second delay path or delay condition occurs. The sequence could be repeated any even number of times again so that the results are averaged for multiple measurements.

In one embodiment, when the Phase Counter 60 reaches count 0, it toggles a flip-flop having an output control line 101. This control line may be connected to mode2 of all the boundary scan cells to change the path between update latch 3 and capture latch 5. The control line may also change the delay of the path by selecting a different output drive or input threshold for a logic gate in the path, especially if the path includes an I/O pad driver and receiver. In another embodiment, the change of delay is controlled by setting a register bit, as described later for FIG. 9.

Figure 5A:
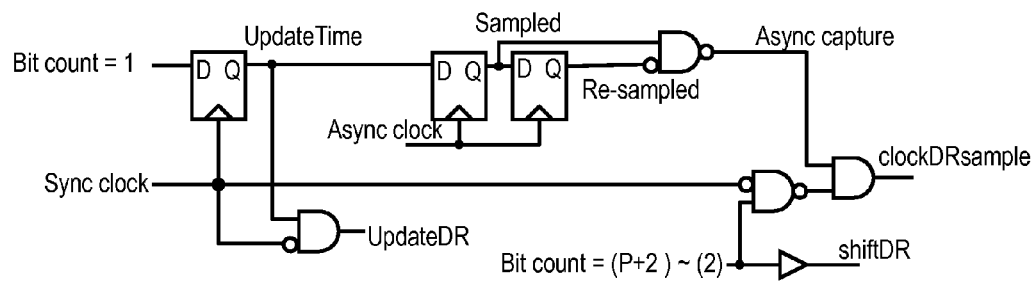
FIG. 5a is a schematic of synchronizer block 62 that generates sampling clock edges synchronous an Async clock frequency that is asynchronous and coherent to a Sync clock frequency, within a timing window provided by the Sync clock, according to an embodiment of the invention.
Figure 5:
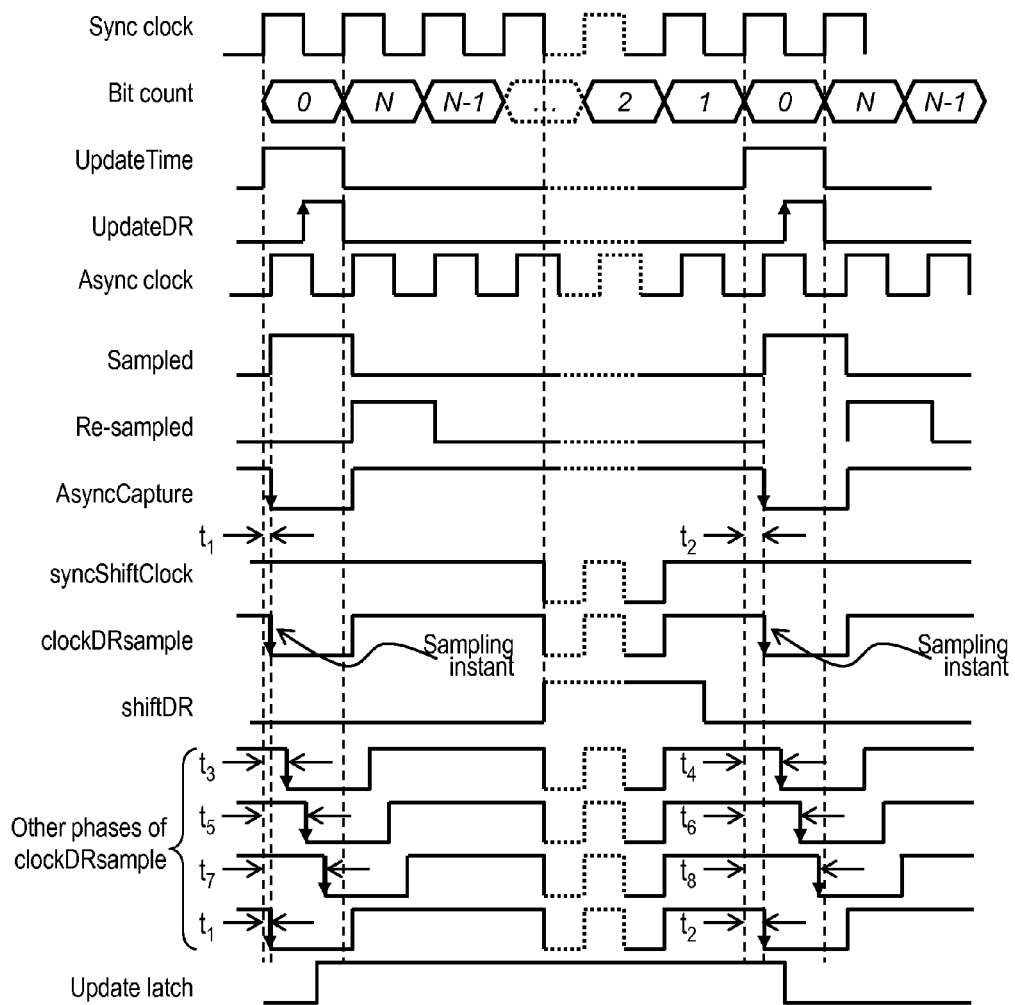
FIG. 5b is a set of waveforms of the synchronizer block circuit in FIG. 5a, with waveform labels indicating the relevant circuit node. "Bit count=" means that a pulse is generated when the Bit Counter count equals the value or range of values shown.

Circuit details for one embodiment's Synchronizer 62 are shown in FIG. 5a, and corresponding waveforms are shown in FIG. 5b. When the Bit Counter 58 count is 1, indicating that all bits but the last bit have been shifted into the BSR (and all previously captured data shifted out), a pulse is produced in the UpdateTime signal. This pulse is then asynchronously sampled by the Async clock to produce a Sampled pulse, and that pulse is re-sampled, using the Async clock, to produce a Re-sampled pulse. Both of these pulses will be either one Async clock cycle in duration or two cycles in duration, depending on whether the Async clock frequency is (slightly) lower or higher, respectively, than the Sync clock frequency. These two pulses are combined to produce a pulse in the AsyncCapture signal that is always one Async clock cycle in duration, and it is a negative pulse to be consistent with 1149.1 waveforms. Its falling edge is active (as indicated by the downward arrow on the AsyncCapture signal in FIG. 5b). The AsyncCapture pulse is combined with a synchronous shift clock signal (syncShiftClock) to produce a clock-DRsample signal; when multiplexers 23 select the Delay Measurement block signals, the clockDRsample signal is selected instead of the TAP controller's clockDR signal. As the Bit Counter counts from its maximum count down to zero, the syncShiftClock waveform contains a number of active clock edges equal to the number of BSR bits, so that a new value for every BSR bit is shifted into the BSR and all captured bits are shifted out prior to each capture edge of the AsyncCapture signal. In various embodiments of the invention, the Async clock frequency is lower than the Sync clock frequency, and each time an AsyncCapture edge occurs, the edge occurs later in the Sync clock period by a time equal to the period difference. The Async frequency could instead be higher than the Sync frequency so that each time an Async capture edge occurs, the edge occurs earlier in the Sync clock period. FIG. 5b shows a sequence of AsyncCapture edge times in the clockDRsample waveform, in the case where each capture edge occurs later in the clock period; when the capture edge occurs at the end of the UpdateTime pulse, the next occurrence is at the beginning of the UpdateTime pulse. The waveform that would appear at the output of the Update latch (and Model multiplexer, and Pad) is shown for reference; it alternates each time an updateDR pulse occurs. The measurement resolution, $T_{RES}$, using this synchronizer is equal to twice the difference between the two clock periods.

Figure 6:
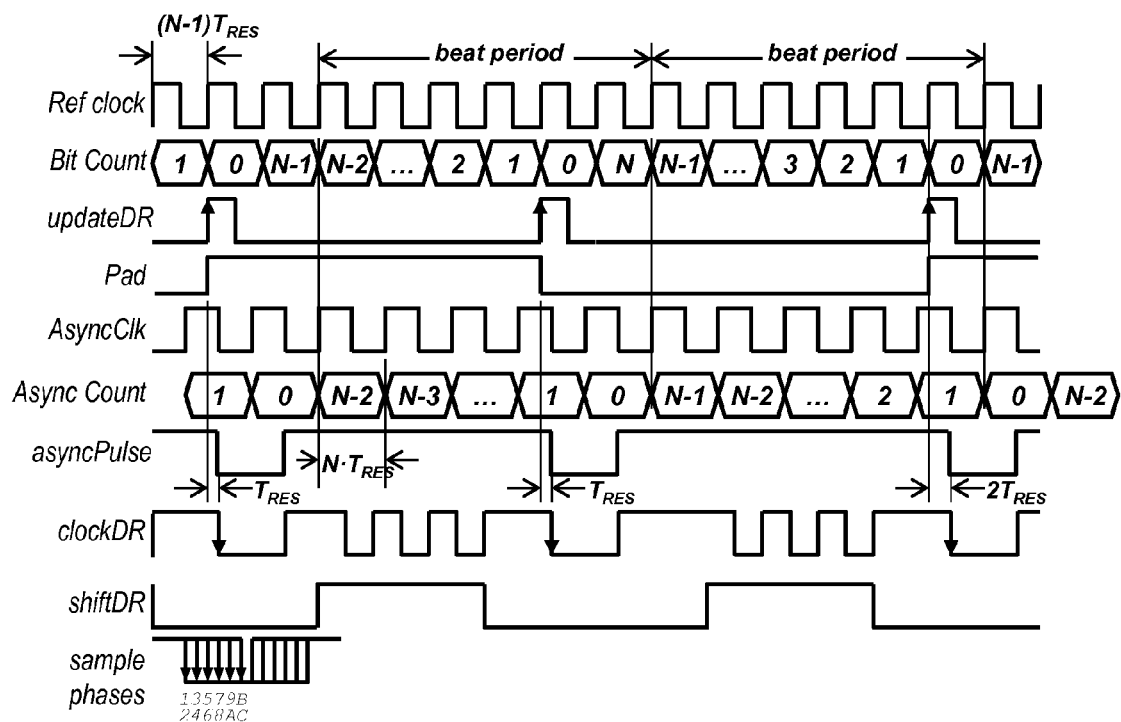
FIG. 6 is a set of waveforms of synchronizer block 62 according to various embodiments of the invention.

Waveforms for Synchronizer 62 in other embodiments of the invention are shown in FIG. 6. $T_{RES}$ using these waveforms is equal to the difference between the two clock periods. The Bit Counter 58 alternately counts from N down to 0, then N−1 down to 0, then N down to 0, then N−1 down to 0, and so on. The Async Count waveform is generated by a second Bit Counter, like Bit Counter 58, that is clocked by the Async clock instead of the Sync clock, and it alternately counts down from N−1 down to 0, then N−2 down to 0, then N−1 down to 0, then N−2 down to 0, and so on. The asyncPulse signal is similar to the asyncCapture signal of FIG. 5b, but it is derived from the Async Count; as shown in FIG. 6, the asyncPulse signal falls when Async Count is 1 and rises when Async Count is 0.

The elements of the State Machine block 41 in FIG. 4 have now been described. Next, the elements of the Pin Measurement block 42 will be described.

Pin Measurement circuit block 42 includes a Pin-address-to-Bit-count compare block 46, a Bit-address register 47, a rise edge detector (the edge detectors may include a median edge detector as described in Sunter patent '921), a toggle flip-flop, and a Rise counter 51 which is a modulo counter. In one embodiment, the modulo base is N/2, and in other embodiments the modulo base is N or an integer multiple of N. A bit address is stored in the Bit-address register 47, corresponding to a BSC position in the BSR. During a measurement, each time the Bit Counter count is equal to the Bit-address register, a pulse is produced by compare block 46 and all logic in the Pin Measurement block is clocked for one cycle of the Sync clock. Each such clock cycle, the scan out (SO) bit 25 of the BSR, which is connected to the measurement scan in (MSI) of the Pin Measurement block, is sampled by the Rise edge detector. The Rise counter is initialized to count 0, and when a rising edge is detected, then the Rise edge detector outputs a pulse that toggles the connected toggle flip-flop. Each time a toggle flip-flop is pulsed, its output changes to 1 if it was 0, or to 0 if it was 1. The Rise counter increments whenever the Pin Measurement block is clocked and the output of the connected toggle flip-flop is 1, therefore the Rise counter counts from a first detected rising edge to a second detected rising edge.

During delay measurement, the BSR data is re-circulated via multiplexer 65 that connects the scan out (SO) of the last BSC in the BSR to the scan in (SI) of the first bit in the BSR. Before a delay measurement, the BSR is loaded with any chosen pattern of bits, and bits are set to enable the output driver for a path whose delay is to be measured. During a delay measurement, a toggle flip-flop output 67 is logic 0 on even counts of the Phase Counter and logic 1 on odd counts (i.e., equal to the least significant bit of the Phase Counter), so that bits loaded into update latches produce an alternating signal. When the Bit Counter count is equal to the Bit-address, the toggle flip-flop's output 67 is selected by multiplexer 65, and when the Bit Counter count is not equal to the Bit-address, the SO output 25 data is selected by the multiplexer so that the SO data is conveyed back to the SI input, thus retaining each BSC bit's original logic value.

Figure 7:
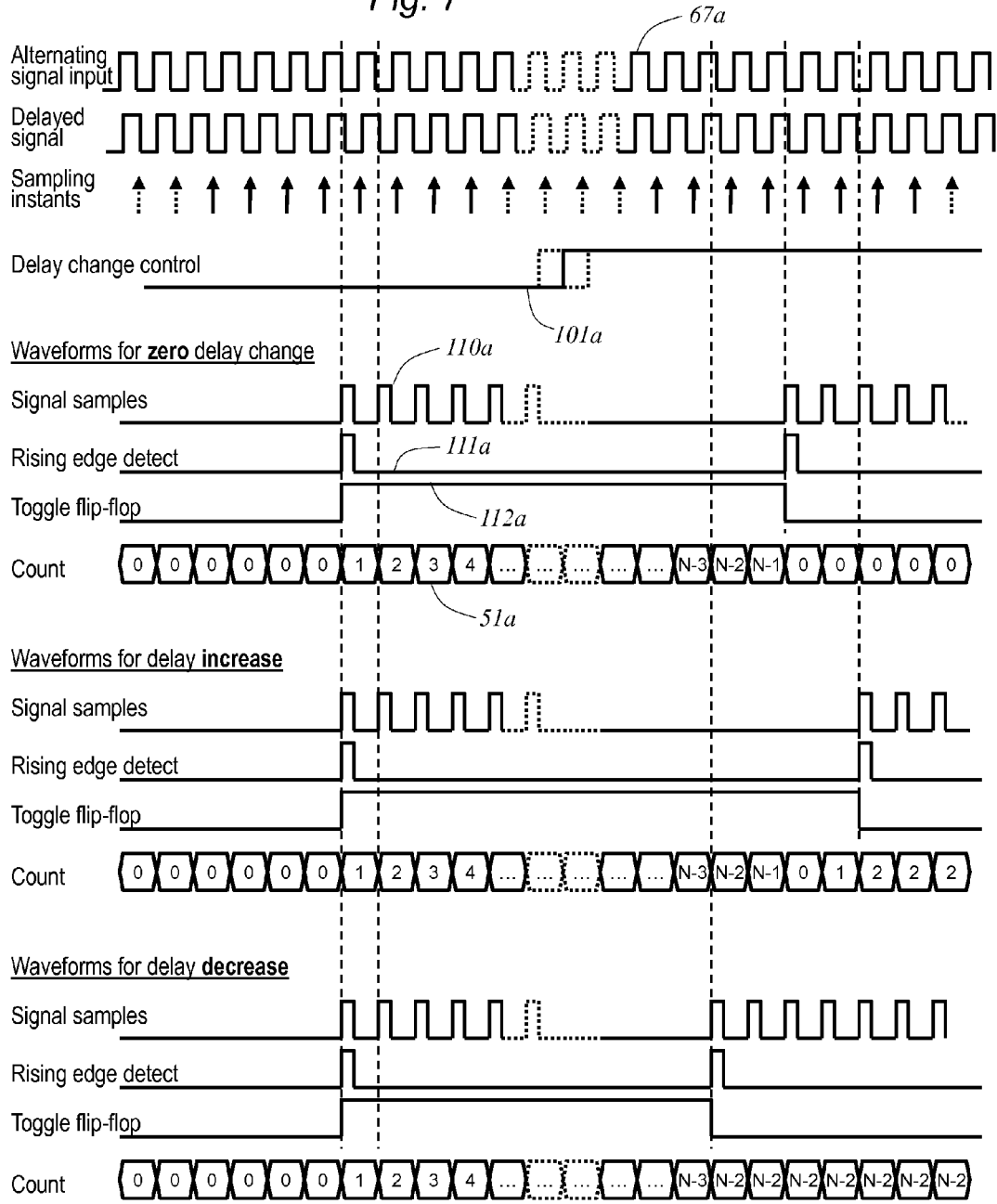
FIG. 7 is a set of waveforms for the delay measurement block 20, for three different delay changes, with waveforms labeled the same as the corresponding node label and appended with 'a', according to an embodiment of the invention.

FIG. 7 shows example waveforms for the circuit of FIG. 4 for three different delay changes. For these examples, the Rise counter's modulo base is N. The three delay cases have the same first rising edge detection time, detected at the same Phase Counter count, and the same delay change timing instant as controlled by the Delay change control signal, which changes when the Phase Counter count reaches zero. In the first case, there is no change in delay detected because the second rising edge detection time occurs N cycles after the first rising edge, when the Phase Counter count has reach the same count as for the first rising edge, and hence the Rise counter's count has returned to zero. In the second case, the delay increases when the second path or characteristic is selected, and the Rise counter counts beyond its initial count. In the third case, the delay decreases when the second path or characteristic is selected and the Rise counter stops counting before it reaches its initial count. Sampling instants are advanced by $N \times T_{RES}$ when there is a transition in the Delay change control, since the transition is generated by the Phase Counter reaching count 0. It is not important when the Delay change control changes state relative to the path signal edge as long as it changes after the first rising edge is detected.

Figure 8:
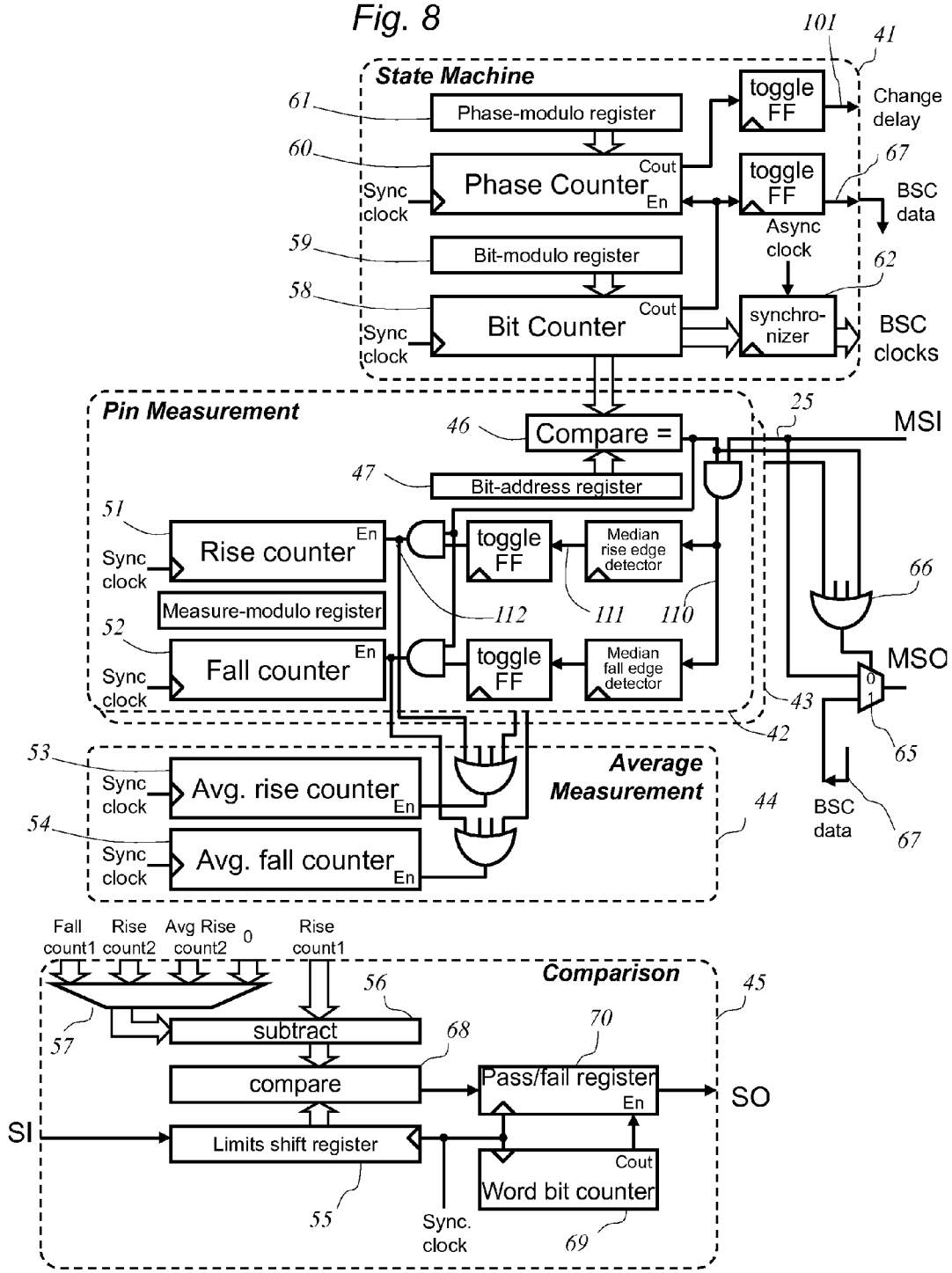
FIG. 8 is a schematic of delay measurement block 20 that tests rising and falling edge delays for multiple paths simultaneously, as well as the average rising edge delay and the average falling edge delay, according to various embodiments of the invention.

FIG. 8 shows an embodiment that contains a first Pin Measurement block 42 and a second Pin Measurement block 43 which is the same as the first block. And both Pin Measurement blocks contain circuitry to measure both a rising edge delay and a falling edge delay simultaneously. The falling edge delay measurement circuitry is the same as for the rising edge except that the edge detector detects falling edges instead of rising edges. Pin Measurement circuit block 42 can be replicated as many times as desired, once for each pin whose delays are to be measured simultaneously with other pins. Thus, delays for any group of pins can be measured simultaneously; members of the group are chosen by loading an address into the Bit-address register of each Pin Measurement block, and each address corresponds to a BSC position in the BSR that corresponds to the I/O delay to be measured. For example, to measure delays for the I/Os controlled by BSC 1 and BSC 3 of the BSR 19 shown in FIG. 3, the binary value for 1 would be loaded into one Pin Measurement block's address, and the binary value for 3 would be loaded into a second Pin Measurement block's address.

FIG. 8 contains an Average Measurement circuit block 44 that contains two counters, 53 and 54, that accumulate the rise and fall counter increments, respectively, of all Pin Measurement blocks so that the two counters' final counts will be proportional to the average rise and fall delays, respectively. One of the two counters is an Average Rise Delay counter that is clocked by the Sync clock for cycles in which any Pin Measurement block's Rise counter is incremented, as detected via an Or gate that has an input from each Rise counter increment input 112. Similarly, the other one of the two counters is an Average Fall Delay counter that is clocked by the Sync clock for cycles in which any Pin Measurement block's Fall counter is incremented. The Average Rise and Average Fall counters are modulo counters, whose modulo base is equal to the modulo base of the Rise and Fall counters multiplied by the number of Pin Measurement blocks. When comparing a Rise or Fall count to the respective Average counter, an equal number of most significant bits is compared, because the Average counters each have more bits than the Rise and Fall counters; in various embodiments of the invention, the number of Pin Measurement blocks is a power of 2 to simplify this comparison.

Comparison block 45 includes a Subtract block 56 that subtracts each serially-shifted-in Rise count from selectably one of: the Fall count of the same Pin Measurement block 42, to compute a rise-fall mismatch count; the Rise count of the next Pin Measurement block 43, to compute a delay difference count; the average Rise count, to compute a delay-average difference count. Multiplexer 57 provides this selection, which may be controlled by a data register (not shown) in the TAP controller. In various embodiments of the invention, when a measurement is complete, all Rise counters 51 and Fall counters 52 for all Pin Measurement blocks are concatenated to form a single shift register (using multiplexers not shown for clarity) that shifts and re-circulates the count data to allow the subtractions or comparisons. The bit contents of a counter that is adjacent to another counter in the serial shift register can therefore immediately follow (or precede) the bit content of that other counter when the counters are concatenated to shift out their bits serially. The two Average counters are also concatenated to each other in a separate re-circulating shift register. The Comparison block also includes a Compare block 68 that compares each serially shifted-in test limit in register 55 to the output of the Subtract block, or to the serial count data (by subtracting zero in the Subtract block), to produce a pass/fail result which is shifted to the pass/fail bit shift register 70 once every W clock cycles, where W is the word-width of each of the counters. First, values are compared to all upper test limits, and then values are compared to all lower test limits; the compare block 68 tests whether the value is less than the upper limit or greater than the lower limit. In various embodiments of the invention, after all subtractions and comparisons to limits have been performed, and all resulting pass/fail bits have been stored in the pass/fail bit shift register, the pass/fail bit register is accessed and shifted off-chip via the TDO pin of the TAP controller.

In various embodiments of the invention, all logic in all the Delay Measurement blocks can be clocked by the Sync clock, except for some of the logic in the Synchronizer block, as shown in FIG. 5a and the Async Count of FIG. 6.

As mentioned, when the decrementing Phase Counter's output count reaches 0, the path being measured is changed, or a characteristic of the path is changed, and then the Phase Counter continues decrementing each time the Bit Counter's output count reaches 0. For an example of changing the path, two paths are of interest in the schematic of FIG. 1: the first path is from an output of Update latch 3, through multiplexer 4 controlled by mode1, through multiplexer 7 controlled by mode2, to Capture latch 5; the second path is from the output of the Update latch 3, through multiplexer 4 controlled by mode1, through output driver 11, through pad 13, through input receiver 14, through multiplexer 6 controlled by mode2, and through multiplexer 7 controlled by mode2, to Capture latch 5. The difference between these two paths is that only the second path includes output driver 11, pad 13, and input receiver 14, therefore the delay through only the output driver, pad, and input receiver can be measured by selecting the first path for the first part of a delay measurement and the second path for the second part of the delay measurement. The mode2 signal controls multiplexer 7 that selects the first path output when mode2 is logic 1 and the second path output when mode2 is logic 0. Therefore, when the Phase Counter's count reaches 0, mode2 may be switched from 1 to 0. The logic levels of mode1 and mode2 are consistent with those in the 1149.1 standard, but other mode signals and logic levels may be used.

Figure 9:
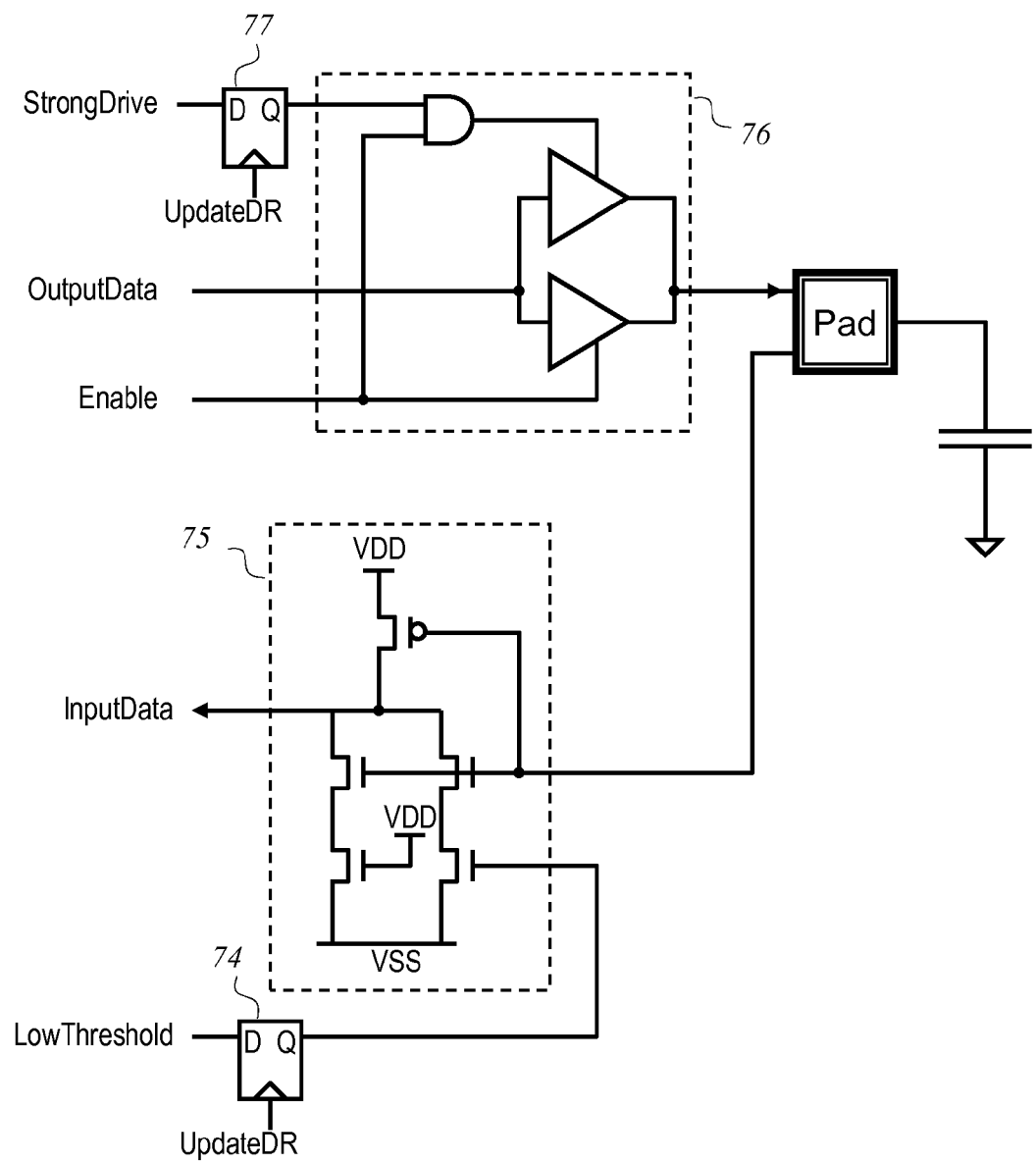
FIG. 9 is a schematic of an output driver whose output drive can be changed by a register bit, and an input receiver whose threshold voltage can be changed by a register bit.

For an example of changing the characteristic of a path, in the schematic of FIG. 1, the second path just described is of interest—the path that includes the output driver, pad, and input receiver. Therefore, mode2 is set to 0 initially and when the Phase Counter's count reaches 0, mode2 stays set to 0, but a characteristic of the output driver or the input receiver is changed. FIG. 9 shows examples of how a path characteristic may be changed: an output driver 76 may have a control register 77 that selects a second driver to increase the maximum current that the driver can deliver, or an input receiver 75 may have a control register 74 that selects a second n-channel transistor that adjusts or changes the input threshold voltage (for example, one threshold for TTL logic levels, and another for CMOS logic levels); in either case, the output of the control register would be switched when the Phase Counter's count reaches 0 so that a different delay is measured through the same path. The characteristic may be changed by loading a data register clocked by the updateDR signal from the TAP controller.

The synchronous, alternating signal may come from another circuit, as selected by multiplexer 4. In this case, multiplexer 4, controlled by the mode1 control signal, can select a first input from a signal in the core of the IC and then a second input from update latch 3. A change in delay may be caused by a difference in the alternating signal's delay or by its signal transition characteristics, for example a slow rise time.

The time taken to switch paths, or a path's characteristics, must either be instant, when the Phase Counter count reaches 0, as in the two examples already described, or any integer multiple of N cycles of the Sync clock, since that will return the phase difference between the Sync and Async clocks to exactly the same phase as when the Phase Counter count reached 0 the first time. Alternatively, the measurement counters can be stopped when it is time to change path conditions, and then restarted after initialization of all counters except the Rise counters and Fall counters.

In various embodiments of the invention, a minimal duration measurement or test of a change in delay comprises the following steps:
1. Serially load TDI data into the BSR, using a serial load clock, maybe synchronous to the TCK clock of the TAP controller.
2. Serially load TDI data into a data register that sets a characteristic of a path.
3. Serially load TDI data into an instruction register that enables a Delay Measurement block (and selects it as the Data Register for subsequent serial data).
4. Serially load TDI data into the Phase-modulo register, the Bit-modulo register, the Average-modulo register, the Measure-modulo register of every Pin Measurement block, the Bit-address registers of every Pin Measurement block, and all other flip-flops in the Delay Measurement block.
5. Serially load data via TDI into an instruction register that selects a first path and enables a measurement to begin.
6. Synchronously to each clock, begin clocking the Delay Measurement block with the Sync and Async clocks.
7. Parallel load modulo base counts into the Phase Counter, the Bit Counter, the Rise and Fall counters of every Pin Measurement block, and the Average Rise and the Average Fall counters.
8. When pre-determined edge-types of the Sync and Async clock align, begin decrementing the Bit Counter on each cycle of the Sync clock; the Phase Counter is decremented each time the Bit Counter reaches count 0.
9. When the Phase Counter count reaches count 0, toggle a selector to select a second path or path characteristic.
10. When the Phase Counter count reaches count 0 for the second time, disable the Bit Counter, the Phase Counter, the Rise and Fall Counters, the Average Rise and Fall counters;
11. Synchronously stop the Sync and Async clocks within the Delay Measurement block, and begin using the serial load clock, which is synchronous to the TCK clock of the TAP controller.
12. If the measurement counts are to be output:
    Synchronously configure the Rise and Fall counters of every Pin Measurement block into a single re-circulating shift register with one of its register bits also connected to the TAP controller's TDO pin.
    Clock the concatenated shift register synchronous to TCK so that all data is output at TDO.
13. If the measurement counts are to be compared to test limits to generate pass/fail results:
    a) Synchronously configure the Rise and Fall counters of every Pin Measurement block into a re-circulating shift register.
    b) Select a first data port input to the Subtract block, from the four shown in FIG. 8 for multiplexer 57.
    c) Serially shift in data from TDI which are concatenated lower test limits for all counts.
    d) As the lower test limits are shifted in, the concatenated counts are serially shifted (at the TCK rate) and re-circulated, and every W bits, a subtraction and comparison to a limit is performed, and a resulting pass/fail bit is loaded into the Pass/Fail Register.
    e) Shift the data contents of the Pass/Fail register out through MSO to TDO (through a multiplexer input not shown for clarity).

f) Repeat steps c) to e, but in step 14 upper test limits are shifted in instead of lower test limits.

g) Repeat steps b) to f), but in step b) select a second data port input.

h) Repeat steps b) to f), but in step b) select a third data port input.

i) Repeat steps b) to f), but in step b) select a fourth data port input.

In noisy circumstances, step 9 could be repeated multiple times, each time toggling between the two paths or path characteristics; the resulting counts in the Rise and Fall counters would be the arithmetic sum (hence average) of the all the delay difference counts. The upper and lower test limits for this measurement should be increased by the same multiple.

If the measured path includes a pad, then external or off-chip circuitry may be connected to the pad. For example, connecting a predetermined impedance (a combination of capacitance, resistance, and inductance) to ground is useful for measuring a delay that is sensitive to the output drive of a pad driver; a larger capacitance will increase the pad path's delay. Also, by connecting an accurately known, relatively large load capacitance, which presents a much lower impedance between the pad and ground than the pad's capacitance alone, the path delay will be predominantly due to the known load capacitance and the (unknown) output drive. This permits the measurement to be more accurate than the pad capacitance alone, since each pad's capacitance for each IC is not known a priori. Furthermore, if the load capacitance is not connected due to some manufacturing defect, then the path delay will be much shorter than expected, and a delay test will fail a lower test limit whose value is larger than the maximum expected unloaded delay.

Figure 10:
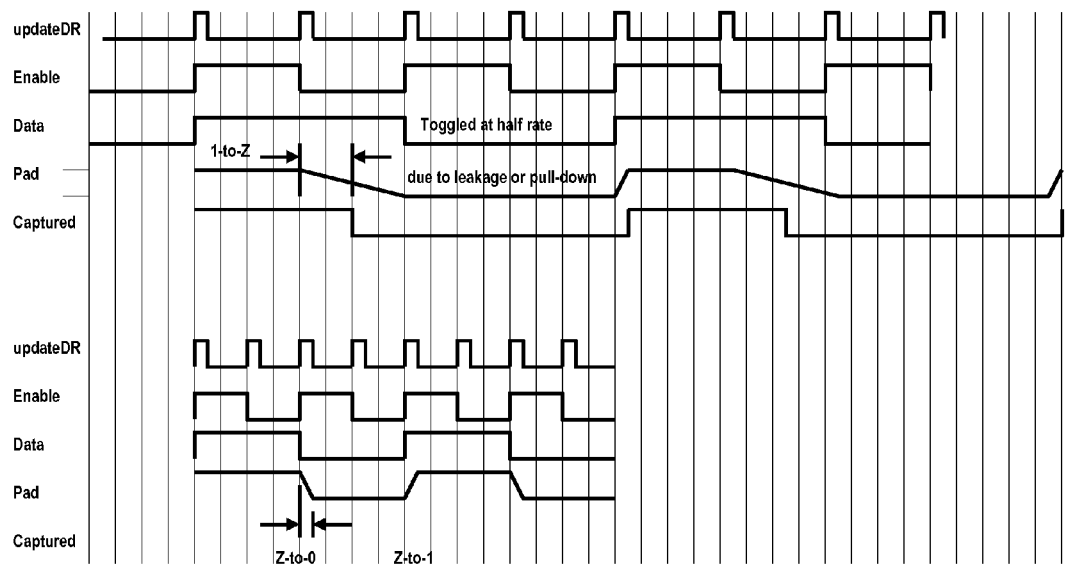
FIG. 10 shows waveforms of the circuit in FIG. 1, when a delay from tristate-to-output-enabled, and from output-enabled-to-tristate measurements are performed, according to various embodiments of the invention.

If a Pin Measurement block's Bit-address register is serially loaded with the BSR address of a BSC 2 that controls the Enable 12 of an output driver 11, and another Pin Measurement block's Bit-address register is serially loaded with the BSR address of a BSC 1 that captures the received data, then the delay from Enable becoming active, or inactive, to a change of pad logic value can be measured. In various embodiments of the invention, the data bit is toggled at half the rate of the enable bit to ensure that the delay is solely due to the Enable transition, as shown in the waveforms of FIG. 10; a separately programmed Half-Rate register bit can be provided within each Pin Measurement block to select the output of a second toggle flip-flop in the State Machine that toggles at half the rate of toggle flip-flop 67 when the Bit counter's count matches the Bit-address in the Pin Measurement block.

Figure 11:
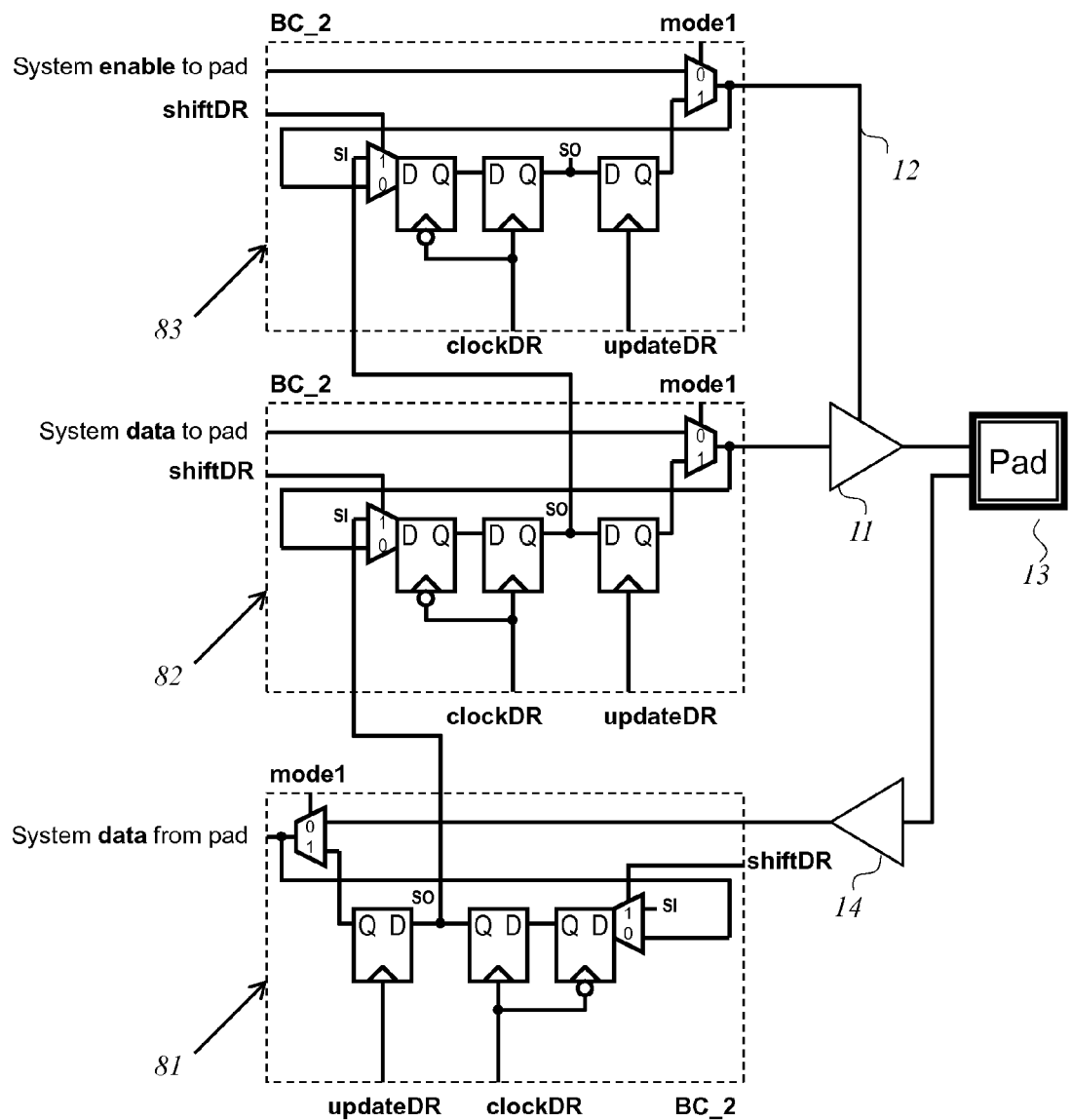
FIG. 11 is a schematic of three boundary scan cells (type BC_2, as defined by 1149.1) connected to a bidirectional I/O.

Various embodiments use a BSR that is compliant with the IEEE 1149.1 boundary scan standard because many new IC designs already include this boundary scan, so adding the Delay Measurement block as shown in FIG. 3 entails minimal intrusion into the existing IC design. Other boundary scan cell types can be accommodated. For example, the BC_7 described in the 1149.1 standard is very similar to that shown in FIG. 1. However, a BC_2 boundary cell is quite different because it uses one BSC for the output data and one BSC for the input data, as shown in FIG. 11. To accommodate the BC_2 boundary cell, each pair of data BC_2 cells, 81 and 82, is connected in series in the BSR via SO-to-SI connections as shown in FIG. 11 (this connection is done typically in the prior art too), and the Bit-address loaded into a Pin Measurement block for the I/O is chosen to be the higher-numbered of the Bit-addresses for the two boundary scan cells (the bit that is closer to the serial output of the BSR is numbered higher). If all boundary scan cells are BC_2, and there are two such cells per I/O (in addition to the BSC for the Enable), and each BSC connected to an I/O receiver on the IC is consistently the higher-numbered BSC bit, then when the output of the Compare block 46 indicates an address match, that bit will be the captured bit loaded into the Rise and Fall edge detectors, as previously described, and both bits are toggled as they are re-circulated back into the BSR (or just the second of the two bits is toggled, since only the second bit is shifted to the I/O's output driver). If some I/Os have one BC_7 cell (one bit per I/O, in addition to the BSC for the Enable) and some have two BC_2 cells, then an additional register bit is set to '1' in the Pin Measurement block if the selected I/O uses BC_2 cells, to cause generation of the bit toggling for a pair of BSR bits (or just the second bit of the pair). This scheme allows a single Pin Measurement block to test a bin that has two data boundary scan cells, however, if no such provision is made, then two Pin Measurement blocks can be used to accomplish the same task—one Pin Measurement block only provides toggling of the data (its Rise and Fall counts are ignored) and the other Pin Measurement block only counts the delay difference (its data toggling has no effect).

To measure the impact of simultaneous switching noise (SSN), which can cause jitter in output signals, a group of I/O pins can be toggled simultaneously and their delays measured. Depending on the impedance in the power rail for the I/O drivers, the delays will be affected by the number of I/O pin drivers that change state simultaneously and by whether they all change in the same direction (rise or fall) or a mixture of directions. The extremes cases are likely to be the following for a group of pins that are proximate to each other: all pins switch in the same direction; all pins switch in the same direction except for one that switches in the opposite direction; only one pin switches. To facilitate these measurements, in various embodiments of the invention, each Pin Measurement block has an additional register bit that selectably inverts the toggled data so that it selects whether the toggling is in the same direction as the other pins or whether it is switches in the opposite direction.

Alternating signals are generated only by update latches of a BSC whose address in the BSR is programmed into a Pin Measurement block. The update latch for each BSC whose bit number is not programmed into a Pin Measurement block is continually loaded with its original contents, recirculated via multiplexer 65, and as a result the update latch output does not generate an alternating signal output during a measurement.

Figure 12:
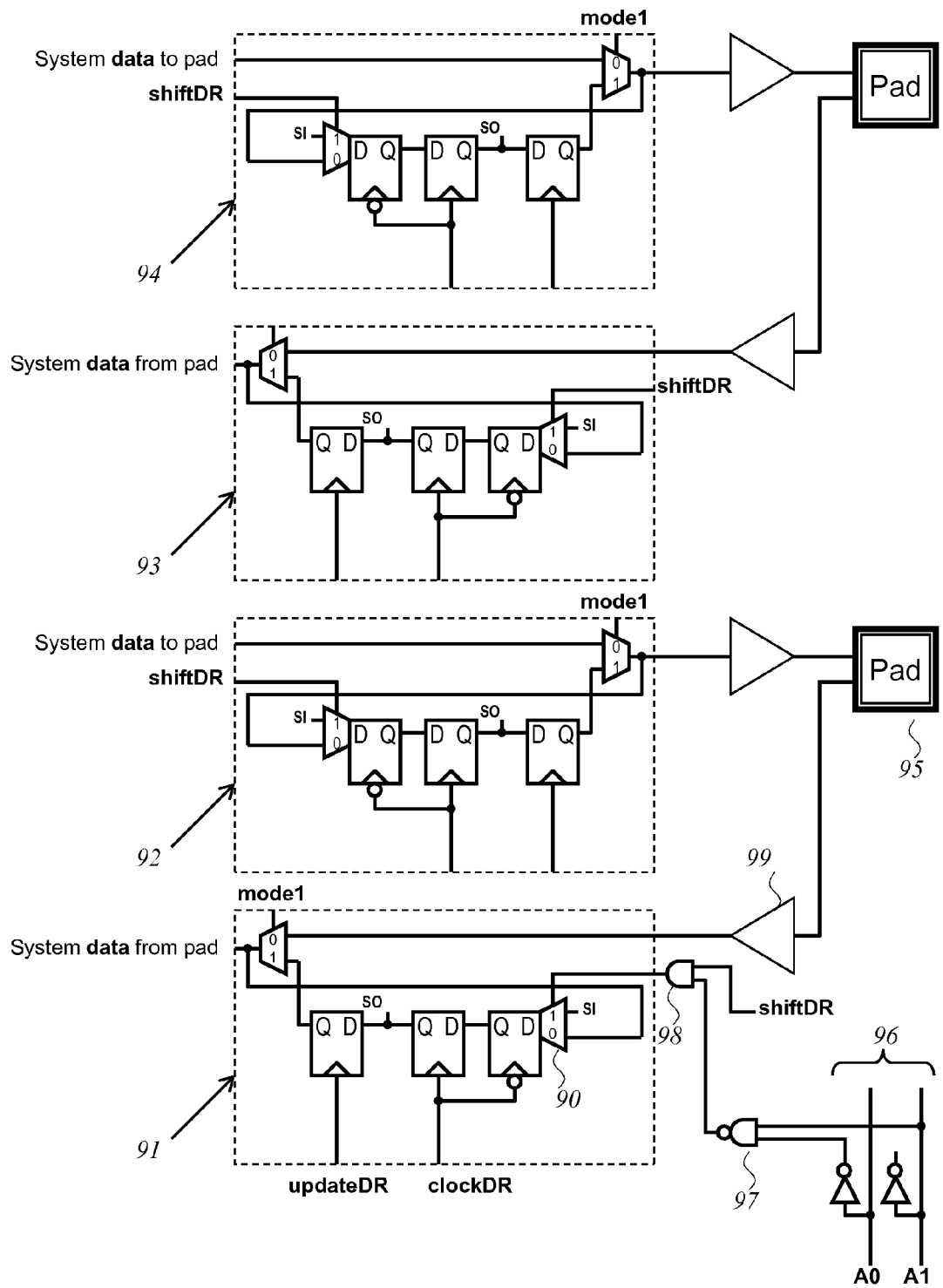
FIG. 12 is a schematic of four boundary scan cells (type BC_2) connected to two bidirectional I/Os, and one of the boundary scan cells includes circuitry to select parallel capture or serial capture, according to various embodiments of the invention.

To measure parameters such as jitter or noise in circuit paths or I/Os, circuitry shown in FIG. 12 could be used for one or more boundary scan cells 91 to permit selection of signals captured in parallel from many receivers as described thus far herein or a signal captured continuously from a single receiver 99. Other boundary scan cells 92, 93, 94 have normal connections to the TAP controller signals, as already shown in FIG. 1 and FIG. 11. The selection of delay path for BSC 91 is controlled by combinational logic gates 97 and 98. When address circuitry 96 contains has input address bits and decoding that produce a logic '0' at the output of Nand gate 97, the output of And gate 98 becomes logic '0' which forces multiplexer 90 to select the data from the pad (possibly via a multiplexer controlled by mode1, which selects pad data). To continuously sample the signal from pad 95, via receiver 99, the mode1 signal is logic '0', shiftDR is logic '1', and clockDR is clocked continuously by the Async clock. Thus the BSR can continuously shift all data from receiver 99 out, clocked by the Async clock, and one sample for each cycle of the Async clock, for jitter or other analysis according to circuitry in Sunter patent '255.

Although this disclosure refers extensively to I/O pins and to the BSR, the inventive circuit can be used to measure delays in circuit paths that are connected to paths internal to an IC, instead of I/O pin circuitry, using any shift register.

The circuit path may be through an analog circuit, such as an analog buffer, filter, or amplifier, whose phase delay, duty cycle, or other timing parameter for an applied stimulus waveform is measured. The output driver controlled by the shift register could provide the stimulus waveform directly to produce a digital step, through a simple filtering circuit (a resistor and capacitor) to produce a sloped or exponential step, or it could trigger generation of a periodic sine waveform synchronous to the Sync clock. Many analog circuit path delays can be measured simultaneously, which is advantageous because some analog circuits have long delays so total measurement time for a group of analog circuits can be reduced.

In various embodiments of the invention, the modulo bases of the Bit Counter 58, the Phase Counter 60, the Rise counter 51, the Fall counter 52, the Average rise counter 53, and the Average fall counter 52 may all be increased by a factor of R, where R is an integer that signifies the measurement range in periods of the clock. R is usually 1 or 2, but it can be larger.

While the invention has been described with respect to specific examples for carrying out the invention, those skilled in the art will appreciate that there are numerous variations and permutations of the above described systems and techniques that fall within the spirit and scope of the invention as set forth in the appended claims.

What is claimed is:

1. A circuit, comprising:
   means for supplying to a circuit-under-test (CUT) an alternating signal that is synchronous to a first clock frequency;
   means for capturing samples of an output signal associated with the alternating signal, the means for capturing being controlled by a capture clock signal synchronous to a second clock frequency that is coherent to the first clock frequency;
   means for changing a path delay, the path delay being associated with the alternating signal traveling from the means for supplying to the means for capturing;
   a modulo counter unit having a modulo base equal to a fraction of or an integer multiple of the number of clock cycles in a beat period, the beat period being the smallest integer number of cycles of the first clock frequency that has a time interval equal to an interval of a different integer number of cycles of the second clock frequency; and
   means for conveying the samples from the means for capturing to the modulo counter unit,
   wherein the modulo counter unit comprises a first modulo counter configured to count the samples between when a first edge is detected in the samples and when a second edge similar to the first edge is detected to derive a delay difference count, and the means for changing is configured to change the path delay at a time between when the first edge is detected and when the second edge is detected.

2. The circuit recited in claim 1, wherein the means for changing comprises one or more multiplexers, the one or more multiplexers configured to select a first path or a second path for the alternating signal to travel from the means for supplying to the means for capturing.

3. The circuit recited in claim 1, wherein the means for changing comprises a circuit that controls an electrical characteristic of the CUT.

4. The circuit recited in claim 1, wherein the means for capturing comprises a sampling latch.

5. The circuit recited in claim 1, wherein the means for conveying comprises a shift register.

6. The circuit recited in claim 5, wherein the means for capturing comprises a sampling latch that is a parallel input latch of the shift register.

7. The circuit recited in claim 5, wherein the means for supplying comprises a latch connected to a parallel output of the shift register.

8. The circuit recited in claim 7, further comprising:
   an address register containing an address corresponding to the serial bit position of one latch within the shift register.

9. The circuit recited in claim 1, wherein the first edge is a signal rising edge or a signal falling edge.

10. The circuit recited in claim 1, wherein the modulo counter unit further comprises a second modulo counter, the first modulo counter and the second modulo counter being configured to simultaneously measure path delay differences for a signal rising edge delay and a signal falling edge.

11. The circuit recited in claim 10, further comprising:
    means for generating a rise-fall mismatch count by comparing results from the first modulo counter and the second modulo counter.

12. The circuit recited in claim 11, further comprising:
    means for generating a pass/fail result by comparing the rise-fall mismatch count count with a test limit.

13. The circuit recited in claim 1, further comprising:
    means for generating a pass/fail result by comparing the delay difference count with a test limit.

14. A system comprising a plurality of circuits, each of the plurality of circuits as defined in claim 1, the system further comprising:
    means for subtracting a first delay difference count derived by a first circuit selected from the plurality of circuits from a second delay difference count derived by a second circuit selected from the plurality of circuits.

15. A system comprising a plurality of circuits, each of the plurality of circuits as defined in claim 1, the system further comprising:
    means for summing delay difference counts derived by the plurality of circuits.

16. The circuit recited in claim 1, wherein the alternating signal is applied to the enable input of a tristate driver.

17. The circuit recited in claim 1, wherein the circuit is configured to be compliant with IEEE 1149.1.

18. The circuit recited in claim 1, further comprising a PLL that generates either the first clock frequency or the second clock frequency.

19. The circuit recited in claim 1, wherein the ratio of the first clock frequency over the second clock frequency is M/N, where M and N are integers differing by one.

20. The circuit recited in claim 1, wherein the means for changing changes the path delay by adjusting a receiver's threshold between logic 0 and logic 1 voltages.

21. The circuit recited in claim 1, further comprising:
    a predetermined impedance connected to a node of the CUT, that is much lower than unknown impedances of the CUT node, to improve the accuracy of a path parameter value estimation based on said change in delay.

22. The circuit recited in claim 1, further comprising:
    means for detecting median edge positions to detect the first edge and the second edge.

23. A method, comprising:
    supplying to a circuit-under-test (CUT) an alternating signal that is synchronous to a first clock frequency;

capturing samples of an output signal of the CUT associated with the alternating signal, the capturing being synchronous to a second clock frequency that is coherent to the first clock frequency;

conveying the samples via a shift register to a modulo counter, the modulo counter having a modulo base that is a fraction of or an integer multiple of the number of clock cycles in a beat period, the beat period being the smallest integer number of cycles of the first clock frequency that has a time interval equal to an interval of a different integer number of cycles of the second clock frequency;

counting the samples between when a first edge is detected in the samples and when a second edge similar to the first edge is detected to derive a delay difference count; and changing a path delay at a time between when the first edge is detected and when the second edge is detected, the path delay being associated with traveling of the alternating signal.

* * * * *